(12) United States Patent
Sakuma et al.

(10) Patent No.: US 7,480,844 B2
(45) Date of Patent: Jan. 20, 2009

(54) METHOD FOR ELIMINATING HOLD ERROR IN SCAN CHAIN

(75) Inventors: Shouji Sakuma, Kasugai (JP); Shinji Fukasawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 547 days.

(21) Appl. No.: 11/156,633

(22) Filed: Jun. 21, 2005

(65) Prior Publication Data

US 2006/0236177 A1    Oct. 19, 2006

(30) Foreign Application Priority Data

Mar. 18, 2005 (JP) .............................. 2005-078856

(51) Int. Cl.
*G01R 31/28* (2006.01)
(52) U.S. Cl. ..................................... 714/726
(58) Field of Classification Search .................. 714/726
See application file for complete search history.

(56) References Cited

U.S. PATENT DOCUMENTS 6,199,183 B1 * 3/2001 Nadaoka ..................... 714/726
6,584,607 B2 * 6/2003 Irie .............................. 716/10
2007/0113213 A1 * 5/2007 Watanabe et al. ............. 716/10

FOREIGN PATENT DOCUMENTS

| JP | 09218888 A | * | 8/1997 |
|---|---|---|---|
| JP | 11-203105 | | 7/1999 |
| JP | 2002-267723 | | 9/2002 |
| JP | 2003-167030 | | 6/2003 |
| JP | 2003-256488 | | 9/2003 |
| JP | 2006268439 A | * | 10/2006 |
| JP | 2006302995 A | * | 11/2006 |

* cited by examiner

*Primary Examiner*—James C Kerveros
(74) *Attorney, Agent, or Firm*—Staas & Halsey LLP

(57) ABSTRACT

A method for eliminating a hold error from a scan chain configured by connecting a plurality of data holding circuits with wiring. The method includes reordering the data holding circuits using the wiring as a delay element to eliminate hold errors from the scan chain. This method eliminates hold errors from the data holding circuits. This keeps the number of buffer circuits inserted between the data holding circuits small and shortens the processing time required for correcting the hold error.

10 Claims, 10 Drawing Sheets

Fig. 9

|   | A    | B    | C    | D    | E    | F    |
|---|------|------|------|------|------|------|
| A | -    | -200 | 0    | +100 | +100 | +100 |
| B | 0    | -    | -300 | 0    | +100 | +200 |
| C | +200 | +100 | -    | +200 | +300 | X    |
| D | +100 | 0    | -100 | -    | -200 | 0    |
| E | +200 | +200 | X    | +200 | -    | +100 |
| F | 0    | 0    | +100 | +100 | 0    | -    |

Fig. 10

Step S13
↓

Step S14:
- Step S21: Determine delay value by virtually wiring SO terminal of each FF to SI terminal of other FFs
- Step S22: Generate list of paths free from setup errors and slew errors
- Step S23: Determine hold margin value and error value for each virtual line, and exclude paths with setup and slew errors
- Step S24: Reorder FFs to minimize number of errors and error values ↓
Step S15

METHOD FOR ELIMINATING HOLD ERROR IN SCAN CHAIN

CROSS-REFERENCE TO RELATED APPLICATIONS

This application is based upon and claims the benefit of priority from the prior Japanese Patent Application No. 2005-078856, filed on Mar. 18, 2005, the entire contents of which are incorporated herein by reference.

BACKGROUND OF THE INVENTION

The present invention relates to a semiconductor integrated circuit including a test circuit that is usable as a scan chain, and more particularly, to a method for eliminating a hold error occurring in a scan chain.

With the scale of digital circuits increasing in recent years, automatic design using a design tool has improved design efficiency of digital circuits. Further, a test circuit for testing the operation of a designed logical circuit is also designed automatically. A scan chain, which is formed by series-connected data holding circuits such as flip-flops, is one technique for conducting the operational test using a test circuit. More specifically, a scan shift test is conducted by operating each of the data holding circuits as a shift register to determine whether the data holding circuit operates normally.

FIG. 1(a) is a schematic circuit diagram showing an example of a scan chain. A large number of scan flip-flops (hereafter referred to as "scan FFs") 1a to 1f are arranged on a semiconductor chip. Each of the scan FFs 1a to 1f has a scan-in terminal SI and a scan-out terminal SO. During the operational test, the scan-out terminal SO of each scan FF is connected to the scan-in terminal SI of another scan FF so that the large number of scan FFs are connected in series.

During the operational test, each scan FF operates as a shift register and latches data provided to its scan-in terminal SI in accordance with a clock signal CK. The scan FF then outputs the latched data from its scan-out terminal SO. It is determined whether each of the scan FFs 1a to 1f is operating normally based on whether each of the scans FF 1a to 1f operates normally as a shift register.

During normal operation, the switching function of each of the scan FFs 1a to 1f disconnects the corresponding scan-in terminal SI and the scan-out terminals SO. After the disconnection, each of the scans FFs 1a to 1f is connected to another corresponding logical circuit so as to operate as a normal flip-flop.

To efficiently conduct the scan shift test using such a scan chain, the scan FFs need to be connected in a manner that a setup error and a hold error do not occur in each scan FF. For this purpose, designing of the scan chain involves the processing described below.

As shown in the flowchart in FIG. 3, the layout position and the wiring length of the scan FFs 1a to 1f are adjusted in a manner that a setup error does not occur in each of the scan FFs 1a to 1f that are connected to form a scan chain (step S1). Then, the hold timings of the scan FFs 1a to 1f are verified (step S2).

Next, the position of each hold error occurring in the scan FFs 1a to 1f is identified (detected), and a value representing a delay time required for eliminating each hold error is determined (step S3). A buffer for generating the necessary delay time is inserted at the position of each hold error (step S4). The timing verification is then performed again (step S5).

If all the hold errors have been eliminated, the setup timing and the hold timing of each scan FF are assumed to have converged on normal timings. The layout process of the scan chain ends (steps S6 and S7). If all the hold errors have not been eliminated, the processing in steps S4 and S5 is repeated.

FIG. 1(b) shows an example in which seven buffer circuits 2a to 2g for eliminating hold errors are inserted at the necessary positions between the scan FFs 1a to 1f.

FIG. 2(a) is a schematic circuit diagram showing another prior art example of a scan chain. Each of the scan FFs 3a to 3d has an output terminal Q, which also functions as a scan-out terminal. The output terminal Q of the scan FF 3a is connected to the scan-in terminal SI of the scan FF 3b and to a logic cell 4a via two buffer circuits 2h and 2i. The output terminal Q of the scan FF 3c is connected to the scan-in terminal SI of the scan FF 3d and to a logic cell 4b via three inverter circuits 5a to 5c.

FIG. 2(b) shows an example of scan chains in which buffer circuits 2j and 2k are inserted between the scan FFs 3a and 3b and buffer circuits 2m and 2n are inserted between the scan FFs 3c and 3d. These buffer circuits are inserted by the above processing to eliminate hold errors between the scan FFs 3a and 3b and between the scan FFs 3c and 3d.

Japanese Laid-Open Patent Publication No. 11-203105 describes a technical concept for reconnecting the scan FFs to shorten the wiring length of the scan chain, and inserting buffer circuits to compensate for insufficient driving capability of the scan FFs.

Japanese Laid-Open Patent Publication No. 2003-256488 describes a technical concept for inserting buffer circuits to adjust the setup timings and the hold timings in the scan chain and reordering the scan chain.

Japanese Laid-Open Patent Publication No. 2003-167030 describes a technical concept for inserting a delay element in a scan data input circuit unit of a scan FF to eliminate hold errors. A transistor having a relatively high threshold is used as the delay element.

Japanese Laid-Open Patent Publication No. 2002-267723 describes a technical concept for alternately operating two scan flip-flops to eliminate hold errors.

SUMMARY OF THE INVENTION

To eliminate a hold error occurring in the scan FFs that form a scan chain, the required buffer circuits are inserted between the scan FFs as shown in FIGS. 1(b) and 2(b). As the number of inserted buffer circuits increases, the chip area in which the scan FFs are mounted increases and the number of times steps S4 to S6 of FIG. 3 are processed increases to lower the design efficiency.

The present invention provides a method for eliminating hold errors from a scan chain by preventing the number of buffer circuits inserted between data holding circuits from increasing, preventing the chip area from increasing, and shortening the processing time required for correcting the hold error.

One aspect of the present invention is a method for eliminating a hold error from a scan chain configured by connecting a plurality of data holding circuits with wiring. The method includes identifying a hold error in the scan chain, and reordering the data holding circuits using the wiring as a delay element to eliminate the hold error from the scan chain.

Another aspect of the present invention is a method for eliminating a hold error from a scan chain configured by connecting a plurality of data holding circuits with wiring. The method includes detecting a position of a hold error in the scan chain and a value of the hold error, reordering the data holding circuits using the wiring as a delay element for decreasing the value of the hold error, and selectively inserting the delay element between the data holding circuits to eliminate the hold error from the scan chain after the reordering.

A further aspect of the present invention is a method for eliminating a hold error from a scan chain configured by connecting a plurality of data holding circuits. Each data holding circuit has a scan-out terminal connected to a delay element and a further data holding circuit. The method includes identifying a hold error in the scan chain, and changing a connection point of the further data holding circuit from the scan-out terminal to the delay element using the delay element to eliminate the hold error from the scan chain.

Another aspect of the present invention is a method for eliminating a hold error from a scan chain configured by connecting a plurality of data holding circuits. Each data holding circuit has a scan-out terminal connected to a delay element and a further data holding circuit. The method includes detecting a position of a hold error in the scan chain and a value of the hold error, changing a connection point of the further data holding circuit from the scan-out terminal to the delay element using the delay element to decrease the value of the hold error, and selectively inserting a delay element between the data holding circuits to eliminate the hold error from the scan chain after changing the connection point.

A further aspect of the present invention is a method for eliminating a hold error from a scan chain configured by connecting a plurality of data holding circuits with wiring. Each data holding circuit has a scan-out terminal connected to a delay element by wiring and a further data holding circuit. The method includes detecting a position of a hold error in the scan chain and a value of the hold error, reordering the data holding circuits using the wiring as a delay element for decreasing the value of the hold error, re-detecting the position of the hold error in the scan chain and the value of the hold error after said reordering, changing a connection point of the wiring of the further data holding circuit from the scan-out terminal to the delay element to decrease the value of the re-detected hold error, and selectively inserting a delay element between the data holding circuits to eliminate the hold error from the scan chain remaining after said changing a connection point.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 9 is a table showing determination results of hold error values and hold margin values for a virtual wiring;

FIG. 10 is a flowchart showing the reordering process in the hold error elimination process;

DETAILED DESCRIPTION OF THE PREFERRED EMBODIMENTS

Figure 1A:
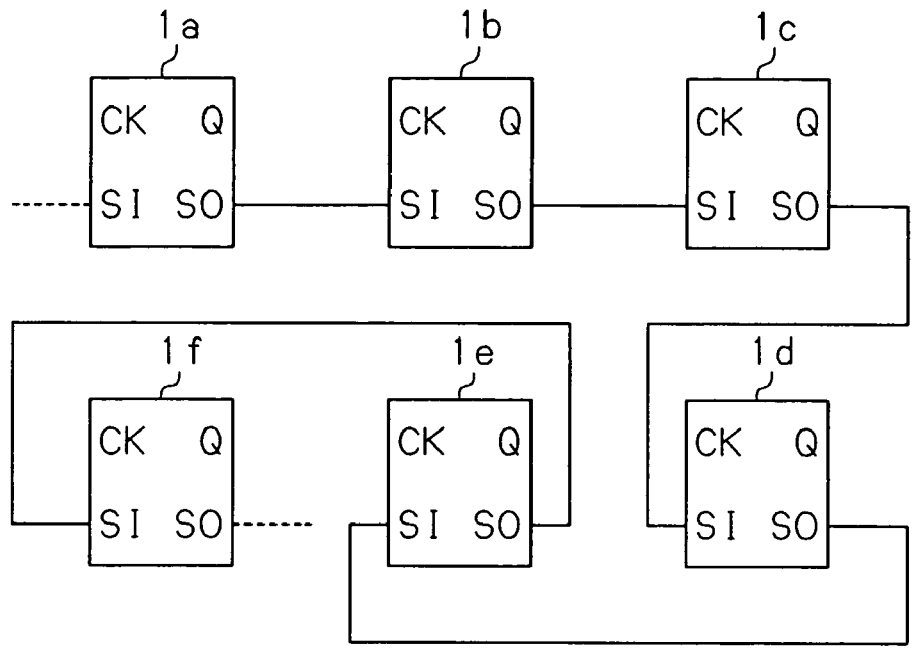
FIG. 1(a) is a schematic circuit diagram showing a first prior art example of a scan chain.
Figure 1B:
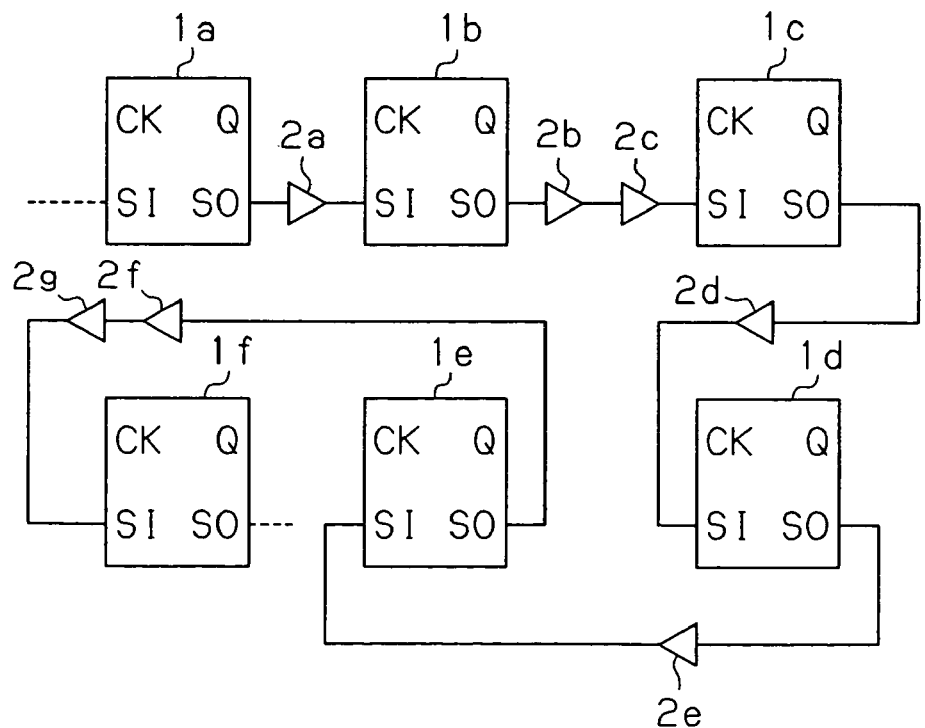
FIG. 1(b) is a schematic circuit diagram showing the scan chain of FIG. 1(a) that has been subjected to a hold error elimination process.
Figure 4A:
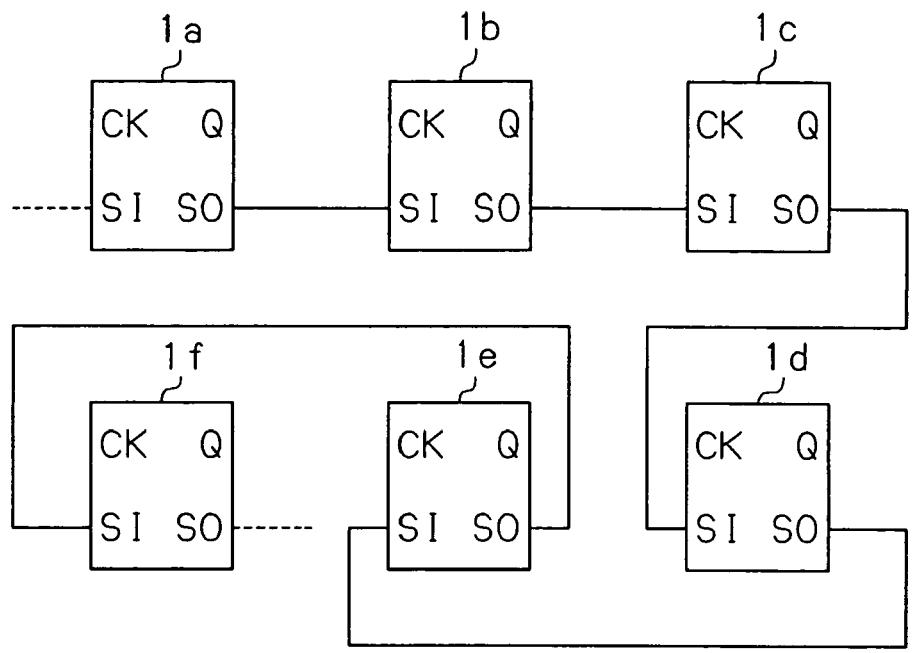
FIG. 4(a) is a schematic circuit diagram showing a scan chain before it undergoes a reordering process of a hold error elimination method according to the present invention.

A method for eliminating a hold error in a scan chain according to a preferred embodiment of the present invention will now be described. FIG. 4(a) is a schematic circuit diagram showing an example of a scan chain. The scan chain is identical to the scan chain shown in FIG. 1(a). The scan FFs (data holding circuits) in the scan chain have the same configuration as the scan FFs shown in FIG. 1(a), and are denoted with the same reference numerals as in FIG. 1(a).

Each of the scan FFs 1a to 1f has a scan-in terminal SI and a scan-out terminal SO. During an operational test, the scan-out terminal SO of each scan FF is connected to the scan-in terminal SI of another scan FF so that a large number of scan FFs are connected in series.

During the operational test, each scan FF operates as a shift register. Further, each scan FF latches data provided to its scan-in terminal SI in accordance with a clock signal CK and outputs the latched data from its scan-out terminal SO. It is determined whether each of the scan FFs 1a to 1f is operating normally based on whether the shift registers in the scan chain operate normally.

During normal operation, the switching function of each of the scan FFs 1a to 1f disconnect the scan-in terminal SI and the scan-out terminal SO of each of the scan FFs 1a to 1f. After the disconnection, each of the scan FFs 1a to 1f is connected to another corresponding logical circuit.

Figure 4B:
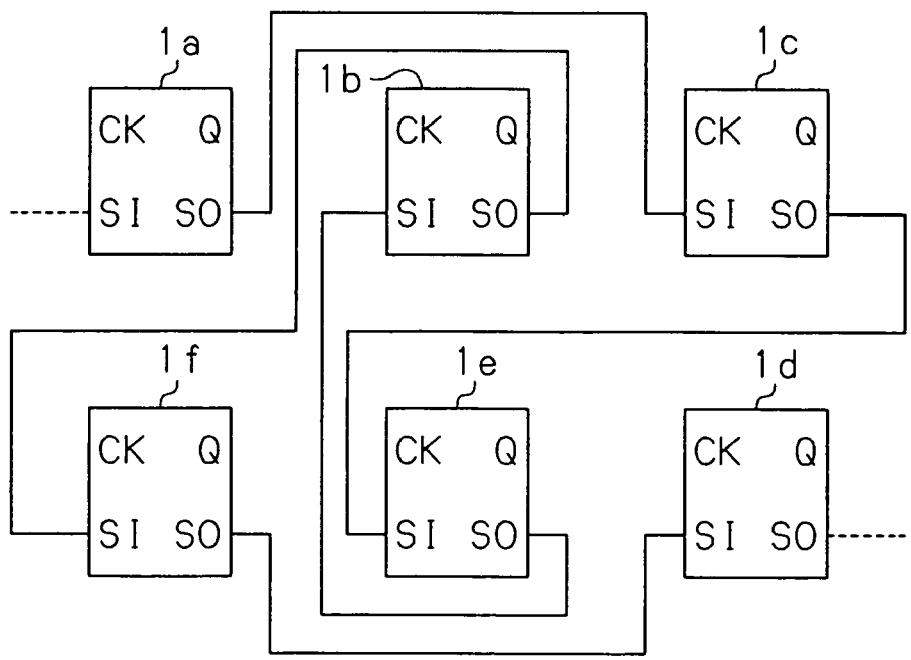
FIG. 4(b) is a circuit diagram showing the scan chain after it undergoes the reordering process.

FIG. 4(b) is a schematic circuit diagram showing an example in which the scan FFs 1a to 1f forming the scan chain are reordered, that is, the connection order of the scan FFs is changed, to eliminate hold errors occurring between the scan FFs.

Figure 6:
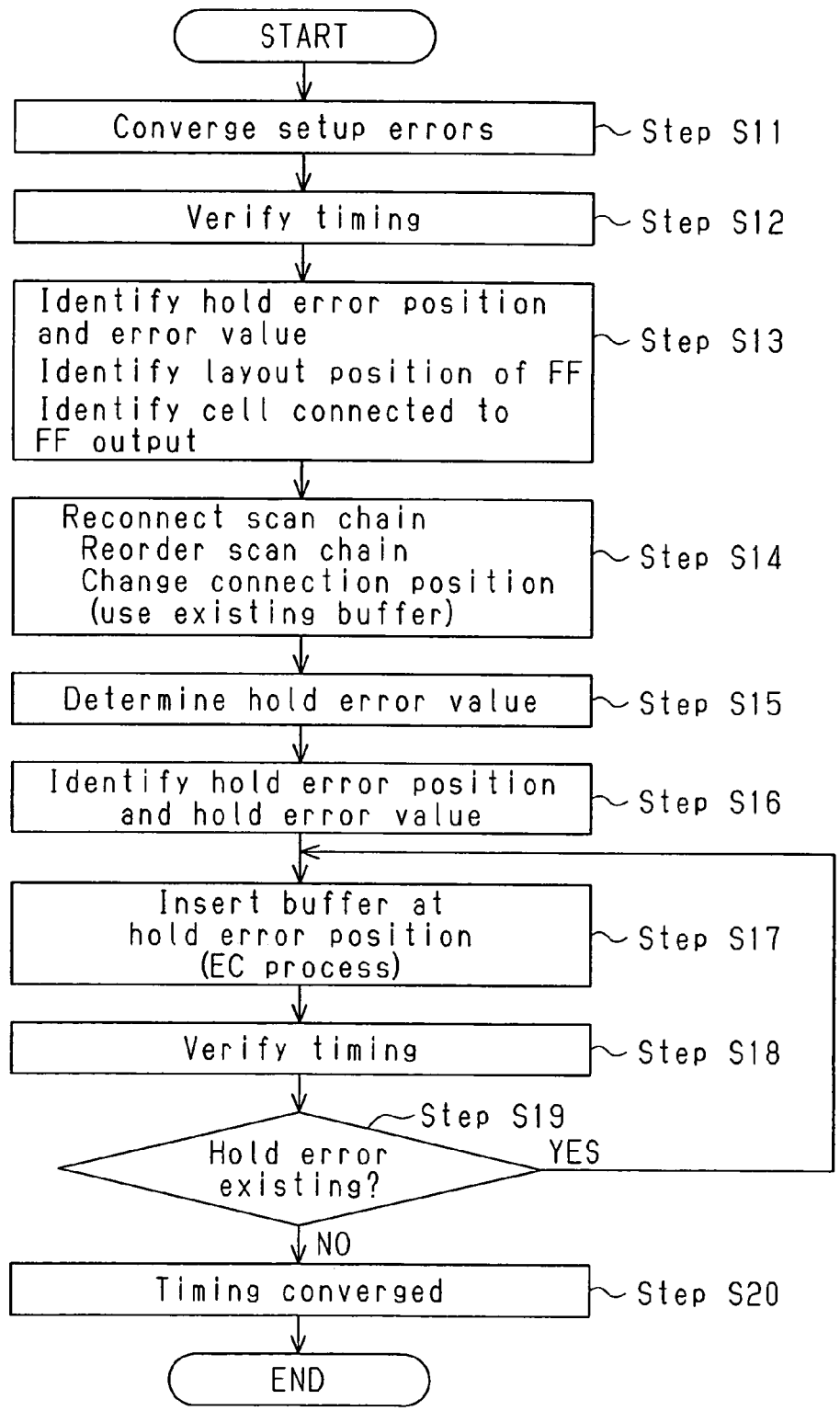
FIG. 6 is a flowchart showing a hold error elimination process of the present invention.

The processing performed using a design tool to eliminate such hold errors will now be described with reference to the flowchart shown in FIG. 6. First, the layout position and the wiring length of the scan FFs 1a to 1f are adjusted so that a setup error does not occur in each of the scan FFs 1a to 1f that are connected to form a scan chain (step S11). Then, the hold timings of the scan FFs 1a to 1f are verified (step S12).

Next, in step 13, the position of each hold error occurring in the scan FFs 1a to 1f is identified, and a value representing the delay time required for correcting each hold error is determined. Further, the layout position of each of the scan FFs 1a to 1f is identified, and the logic cell connected to the output terminal of each of the scan FFs 1a to 1f is identified.

Next, a process for reconnecting the scan FFs in the scan chain to eliminate hold errors is performed (step S14). The reconnection process includes a reordering process and a connection point changing process. The reordering process reorders the scan FFs. The connection point changing process is performed to include existing buffer circuits in the scan chain.

Next, the hold timings of the scan FFs 1a to 1f are verified again (step S15). The position of each hold error is identified, and a value representing the delay time required for correcting each hold error is determined again (step S16).

Then, an EC process for inserting a buffer circuit that generates the necessary delay time at the position of each hold error is performed (step S17), and the timing verification is performed again (step S18). If all the hold errors have been eliminated, the hold timings are assumed to have converged to normal timings, and the layout process for the scan chain ends (steps S19 and S20). If the hold errors have not been eliminated, steps S17 and S18 are repeated.

FIG. 4(b) is a schematic circuit diagram showing a state in which the reordering process for the scan FFs 1a to 1f has been performed in step S14. When a hold error is occurring between the scan FFs 1a to 1f, the length of the wiring between the scan FFs 1a to 1f is adjusted to adjust the delay time of scan data provided to each scan-in terminal SI. This eliminates hold errors.

More specifically, the scan FFs in the scan chain connected in the order shown in FIG. 4(a) are reconnected in the order of FF 1a, FF 1c, FF 1e, FF 1b, FF 1f, and FF 1d. This eliminates hold errors or shortens the hold error time.

Figure 2A:
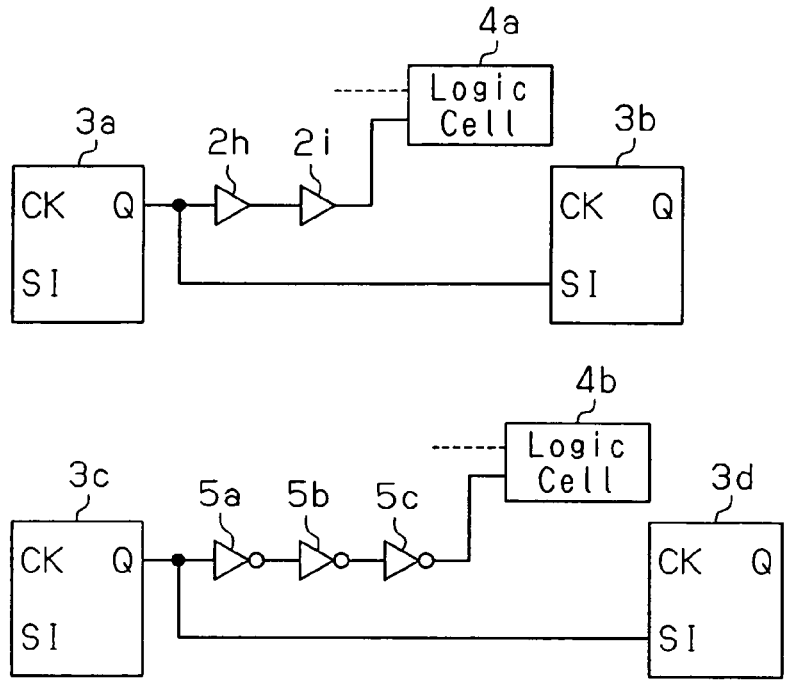
FIG. 2(a) is a schematic circuit diagram showing a second prior art example of scan chains.
Figure 2B:
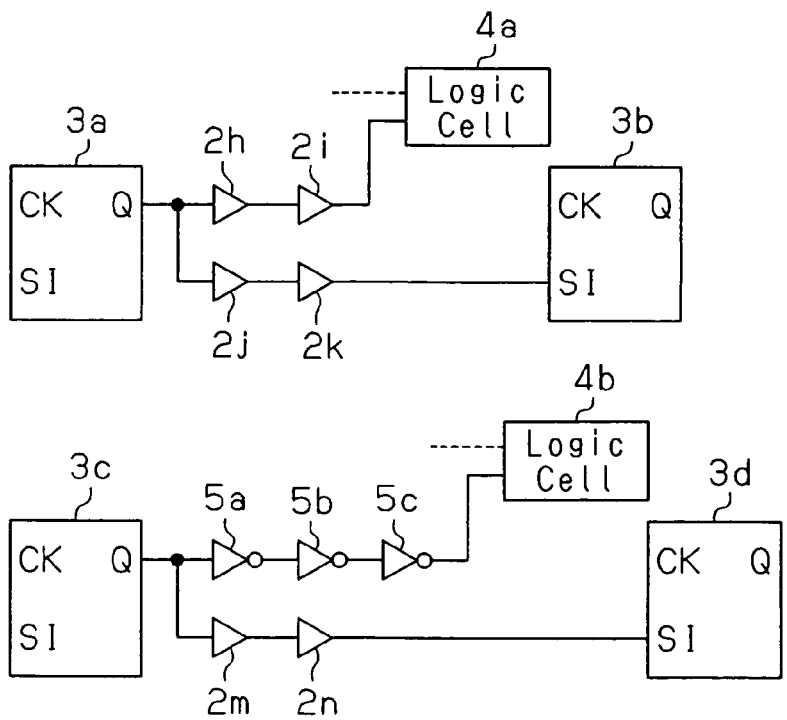
FIG. 2(b) is a schematic circuit diagram showing the scan chains of FIG. 2(a) that have been subjected to a hold error elimination process.
Figure 3:
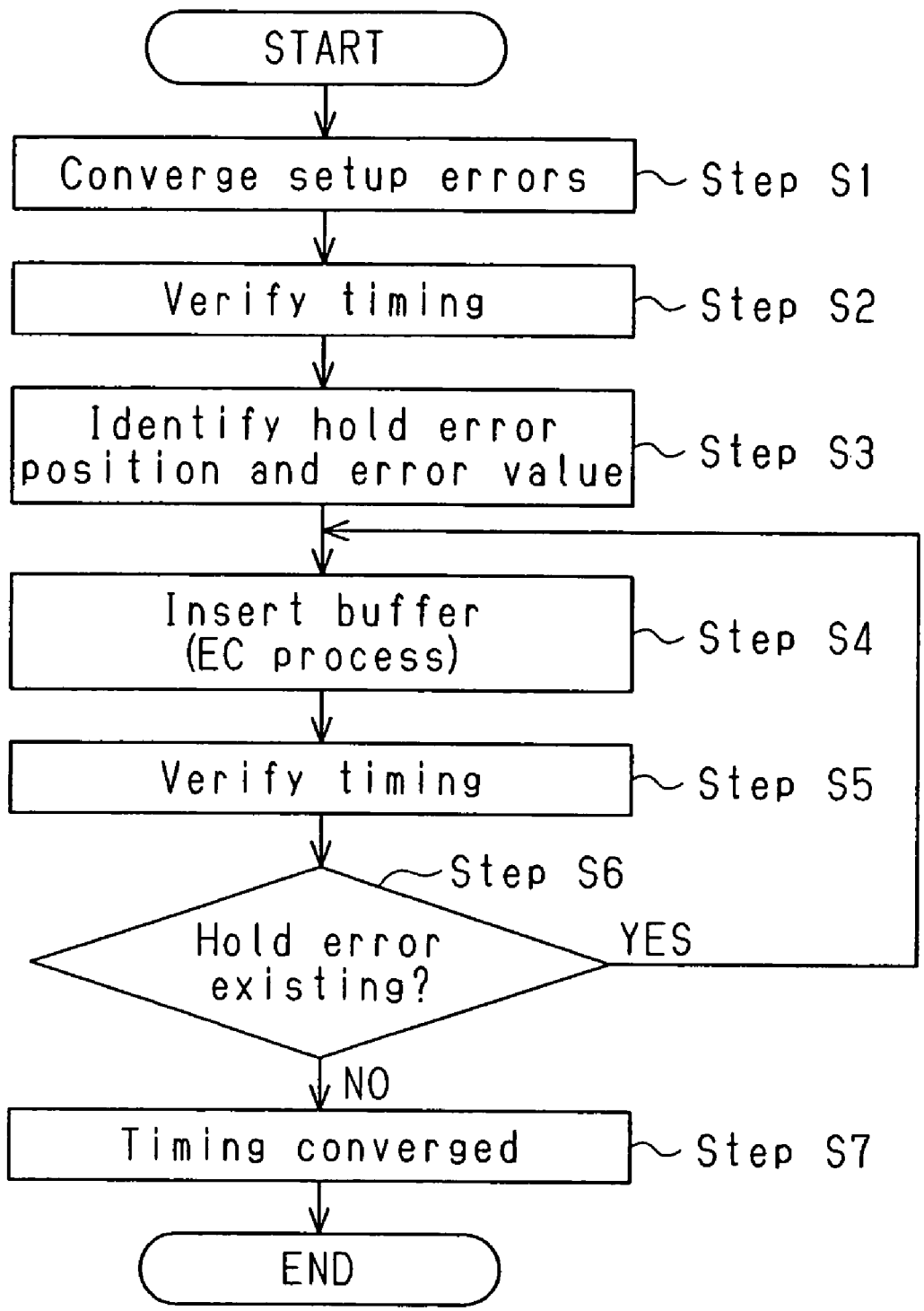
FIG. 3 is a flowchart showing a hold error elimination process in the prior art.
Figure 5A:
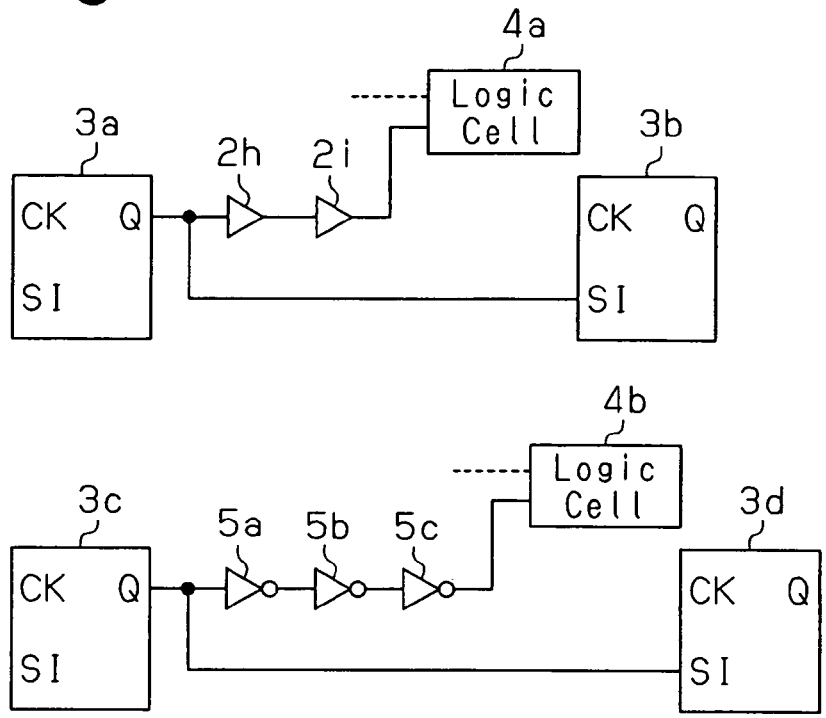
FIG. 5(a) is a schematic circuit diagram showing scan chains before they undergo a connection point changing process of the hold error elimination method of the present invention.

FIG. 5(a) is a schematic circuit diagram showing an example of other scan chains. The scan FFs in the scan chains have the same configuration as the scan FFs shown in FIG. 2(a) and are denoted with the same reference numerals. Each of the scan FFs 3a to 3d has an output terminal Q, which also functions as a scan-out terminal. The output terminal Q of the scan FF 3a is connected to the scan-in terminal SI of the scan FF 3b and also to a logic cell 4a via two buffer circuits 2h and 2i. The output terminal Q of the scan FF 3c is connected to the scan-in terminal SI of the scan FF 3d and to a logic cell 4b via three inverter circuits 5a to 5c.

Figure 5B:
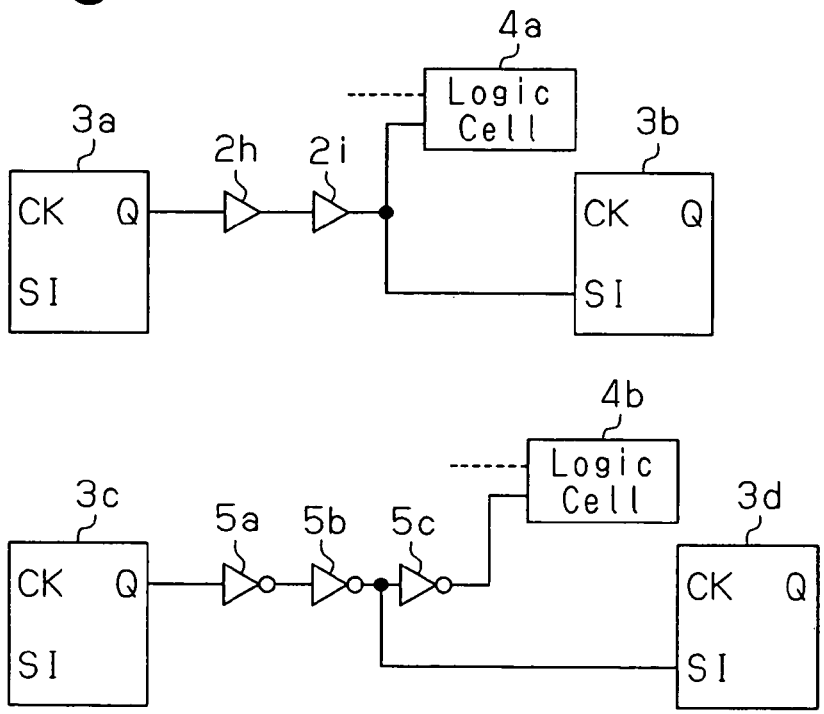
FIG. 5(b) is a schematic circuit diagram showing the scan chains after they undergo the connection point changing process.

When a hold error is occurring between the scan FFs 3a and 3b and between the scan FFs 3c and 3d in the scan chains, the connection point changing process is performed in step S14 as shown in FIG. 5(b).

Between the scan FFs 3a and 3b, the output terminal of the buffer circuit 2i is connected to the scan-in terminal SI of the scan FF 3b so that the buffer circuits 2h and 2i are included in the scan chain. The number of buffer circuits inserted between the scan FFs 3a and 3b is determined based on the hold error value determined in step S13.

Between the scan FFs 3c and 3d, the output terminal of the inverter circuit 5b is connected to the scan-in terminal SI of the scan FF 3d so that the inverter circuits 5a and 5b are included in the scan chain. The inverter circuits 5a and 5b inserted between the scan FFs 3c and 3d are used as buffer circuits. Since the inverter circuits 5a and 5b are used as buffer circuits, the number of inverters must be an even number. The number of inverters is determined based on the hold error value determined in step S13.

Figure 7:
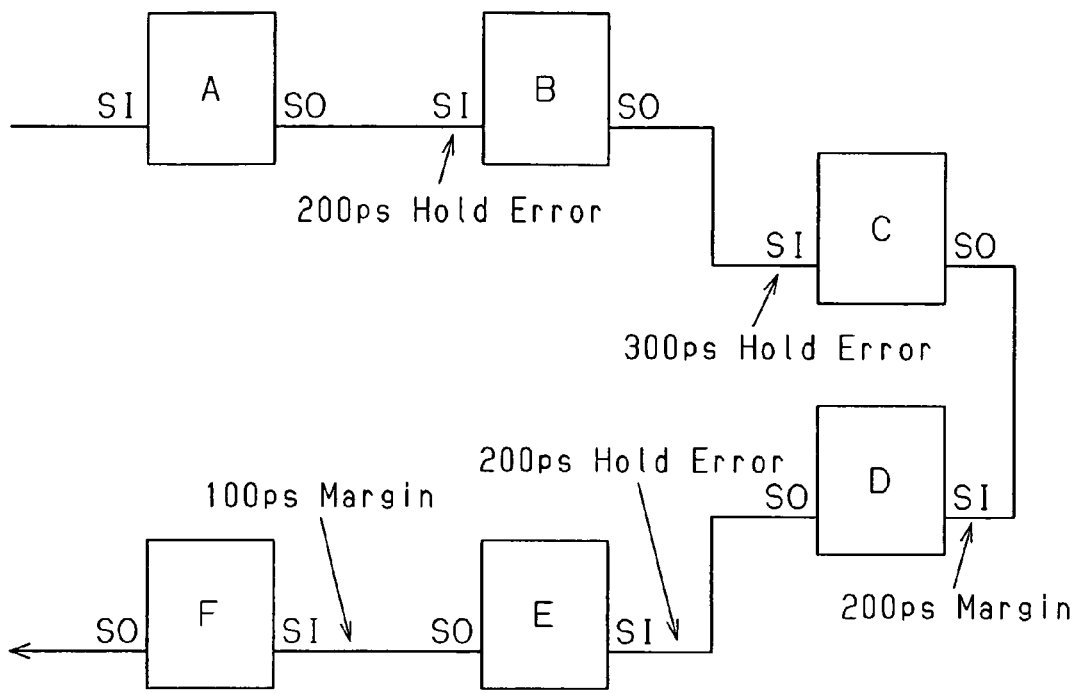
FIG. 7 is a schematic circuit diagram showing a scan chain before it undergoes a reordering process in the hold error elimination process.

The process for reordering the scan FFs in the scan chain, which is performed in step S14, will now be described in more detail with reference to FIGS. 7 to 10. FIG. 7 is a schematic circuit diagram showing a scan chain before it undergoes the reordering process. The scan chain is configured by scan FFs, which are denoted by the letters A to F.

FIG. 7 shows the scan chain in the state after the position of each hold error is identified and a value representing the delay time required for correcting each hold error is determined in step S13 as described above. A hold timing margin value is also determined for each path. More specifically, a hold error of 200 ps occurs between the scan FFs A and B, a hold error of 300 ps occurs between the scan FFs B and C, a margin of 200 ps exists between the scan FFs C and D, a hold error of 200 ps exits between the scan FFs D and E, and a margin of 100 ps exits between the scan FFs E and F.

Next, as shown in FIG. 10, each scan FF is virtually wired to other scan FFs, and the delay time in each virtual wiring is determined as a delay value (step S21). Then, a list of paths (virtual wiring) free from setup errors and slew error are generated (step S22).

Next, the hold error value and the hold margin value are determined for each of the listed virtual wiring paths (step S23). FIG. 9 shows the determination results as one example. In FIG. 9, letters A to F along the horizontal axis indicate the scan FFs at the data output side, and letters A to F along the vertical axis indicate the scan FFs at the data input side. In FIG. 9, positive values represent hold margin values, and negative values represent hold error values. For example, a path connecting the scan FFs A and B has a hold error of 200 ps, and a path connecting the scan FFs C and A has a hold margin value of 200 ps. Further, X represents the occurrence of a setup error and a slew error. A setup error and a slew error are occurring in a path connecting the scan FFs C and F and a path connecting the scan FFs E and C. These paths cannot be used in scan chains and are thus excluded.

Next, the scan FFs are reordered in a manner to minimize the number of hold errors and the values of hold errors based on the determination results shown in FIG. 9 (step S24).

Figure 8:
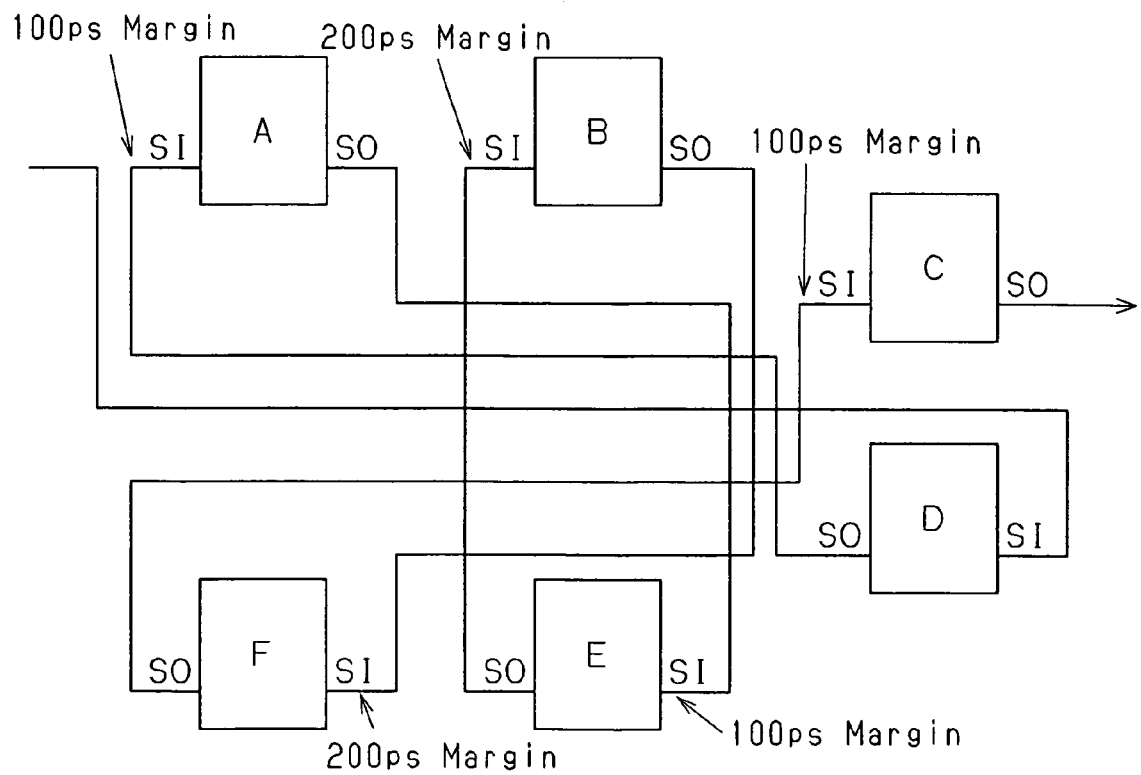
FIG. 8 is a schematic circuit diagram showing the scan chain after it undergoes the reordering process.

FIG. 8 is a schematic circuit diagram showing the scan chain after undergoing the reordering process. The scan FFs in the scan chain are connected in the order of D, A, E, B, F, and C. In this state, each path has a hold margin value.

Figure 11:
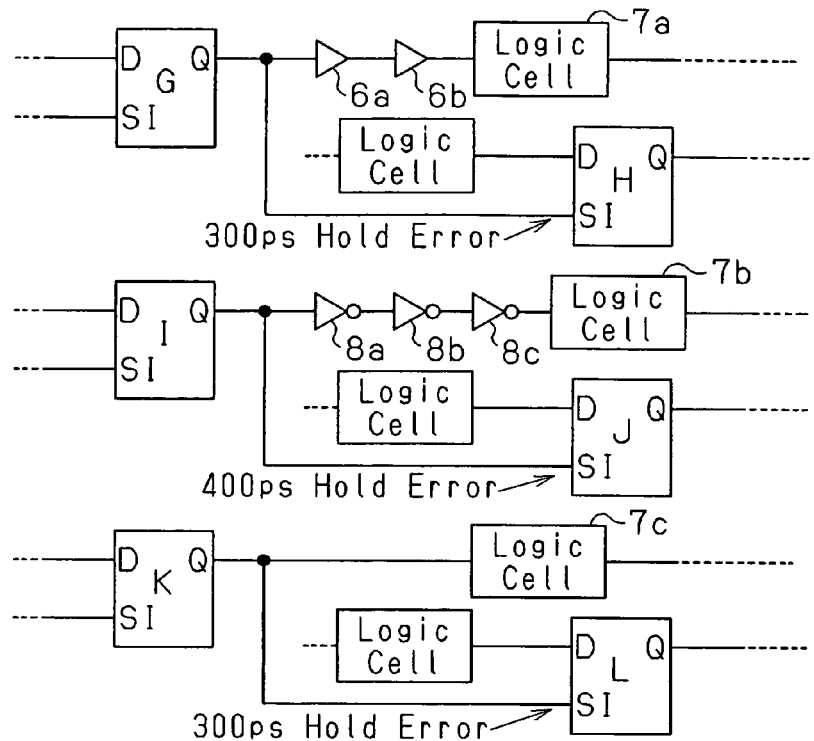
FIG. 11 is a schematic circuit diagram showing scan chains before they undergo a connection point changing process in the hold error elimination process.
Figure 12:
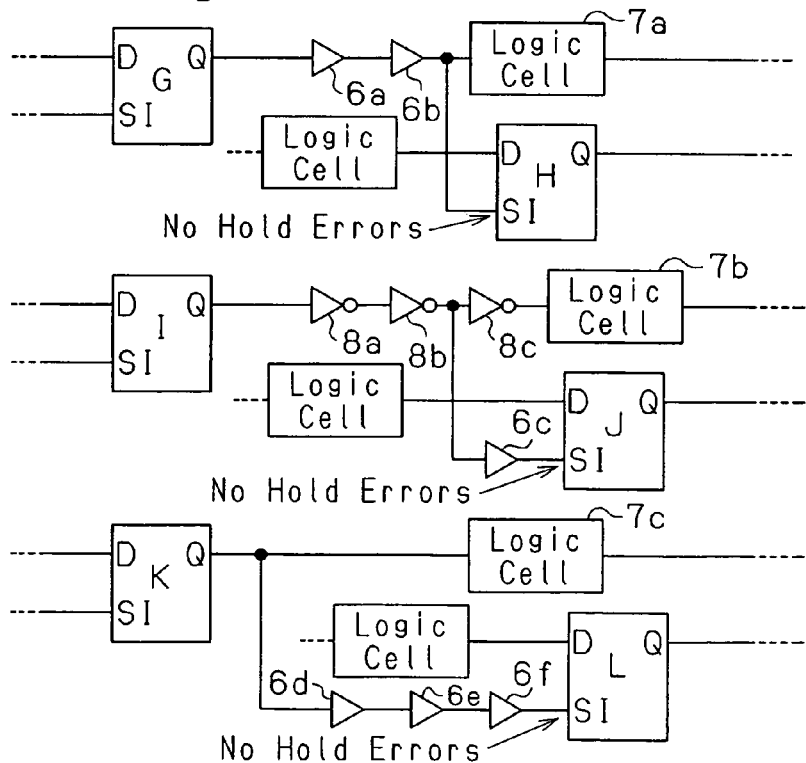
FIG. 12 is a schematic circuit diagram showing the scan chains after they undergo the connection point changing process.

The connection point changing process, which is performed in step S14, will now be described in more detail with reference to FIGS. 11 to 13. FIG. 11 is a schematic circuit diagram showing scan chains before they undergo the connection point changing process. The scan chains are configured by scan FFs denoted by letters G to L. Each of the scan FFs G to L has an output terminal Q, which also functions as a scan-out terminal.

A path connecting the scan FFs G and H configures a scan chain. A path connecting the scan FFs I and J configures a scan chain. A path connecting the scan FFs K and L configures a scan chain. In step S13, a hold error of 300 ps is determined for the path connecting the scan FFs G and H, a hold error of 400 ps is determined for the path connecting the scan FFs I and J, and a hold error of 300 ps is determined for the path connecting the scan FFs K and L.

In step S13, the layout position of each scan FF is identified. More specifically, the layout position of each scan FF is identified as that the output terminal Q of the scan FF G is connected to a logic cell 7a via buffer circuits 6a and 6b, the output terminal Q of the scan FF I is connected to a logic cell 7b via inverter circuits 8a to 8c, and the output terminal Q of the scan FF K is directly connected to a logic cell 7c.

Figure 13:
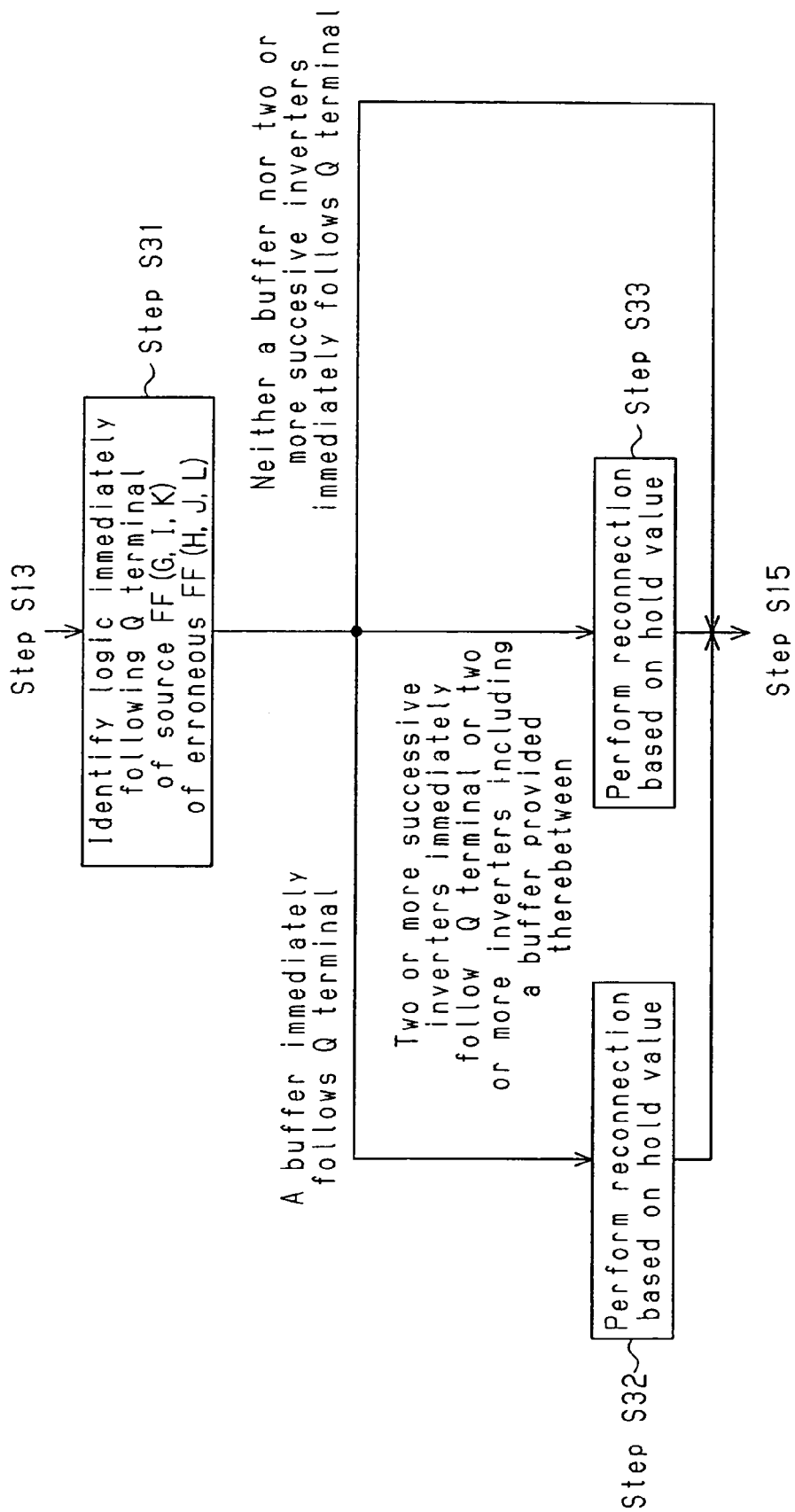
FIG. 13 is a flowchart showing the connection point changing process in the hold error elimination process.

In step S14, it is identified whether a buffer circuit, an inverter circuit, or none of these is connected between the output terminals Q of the scan FFs G, I, and K and the logic cells 7a to 7c as shown in FIG. 13 (step S31) The scan FFs G, I, and K respectively provide data to the scan FFs H, J, and L when a hold error is occurring.

In the path connecting the scan FFs G and H, the buffer circuits 6a and 6b are connected to the output terminal Q of the scan FF G. In this case, the point at which the scan FF H is connected is changed as shown in FIG. 12 based on a hold error value (step S32). Then, the processing proceeds to step S15.

In the path connecting the scan FFs I and J, two or more inverter circuits, namely, the inverter circuits 8a to 8c, are successively connected to the output terminal Q of the scan FF I. In this case, the point at which the scan FF J is connected is changed so that an even number of inverter circuits are used as buffer circuits as shown in FIG. 12 (step S33). Then, the processing proceeds to step S15.

In the path connecting the scan FFs K and L, neither a buffer circuit nor an inverter circuit is connected between the output terminal Q of the scan FF K and the logic cell 7c. In this case, the processing proceeds to step S15 without changing the point at which the scan FF L is connected.

Next, hold error values are determined again in step S15. If a hold error remains in the path connecting the scan FFs I and J, a buffer circuit 6c is added between the inverter circuit 8b and the scan FF J. Further, if a hold error remains in the path connecting the scan FFs K and L, buffer circuits 6d to 6f are inserted between the scan FF K and the scan FF L.

The hold error elimination method of the present invention has the advantages described below.

(1) To eliminate hold errors from a scan chain, the scan FFs in the scan chain are reordered using a delay that is generated by changing the wiring length between the scan FFs. In this way, hold errors are eliminated or the value of the hold error is decreased without having to insert a buffer between the scan FFs.

(2) To eliminate hold errors from the scan chain, the point at which each scan FF in the scan chain is connected is changed in a manner that an existing buffer circuit or an inverter circuit connected to the output terminal of each scan FF is incorporated into the scan chain. This eliminates hold errors or decreases the value of the hold error without having to insert a buffer between the scan FFs.

(3) After the scan chain is reordered, the hold timings are verified again. If a hold error still remains, a buffer circuit is inserted at the position of the hold error. This reduces the number of buffer circuits that are inserted to eliminate a hold error.

(4) After the connection point of each scan FF in a scan chain is changed, the hold timings are verified again. When a hold error still remains, a buffer circuit is inserted at the position of the hold error. This reduces the number of buffer circuits that are inserted to eliminate a hold error.

(5) Since the number of buffer circuits inserted between the scan FFs is reduced, the chip area is prevented from increasing.

(6) Since the number of buffer circuits inserted between the scan FFs is reduced, the number of times the processing in steps S17 to S19 is performed is reduced.

It should be apparent to those skilled in the art that the present invention may be embodied in many other specific forms without departing from the spirit or scope of the invention. Particularly, it should be understood that the present invention may be embodied in the following forms.

The present invention is also applicable to a scan chain that is formed by data holding circuits other than flip-flops.

To eliminate hold errors, both the reordering process and the connection point changing process may be performed. In this case, it is preferable that the position of each hold error and the value of each hold error be identified in both the reordering process and the connection point changing process. The reordering of the scan FFs when changing connection points of the scan FFs eliminate hold errors with less buffers inserted between the scan FFs.

When both the reordering process and the connection point changing process are performed, it does not matter whichever one of the reordering process and the connection point changing process is performed first.

It should be apparent to those skilled in the art that the present invention may be embodied in many other specific forms without departing from the spirit or scope of the invention. Particularly, it should be understood that the present invention may be embodied in the following forms.

What is claimed is:

1. A method for eliminating a hold error from a scan chain configured by connecting a plurality of data holding circuits with wiring, the method comprising:
    determining a hold error value and a hold margin value for each virtual wiring connecting the data holding circuits;
    determining a combination of virtual wirings so that all virtual wirings have the hold margin value; and
    reordering the data holding circuits based on the determined combination.

2. A method for eliminating a hold error from a scan chain configured by connecting a plurality of data holding circuits with wiring, the method comprising:
    determining a hold error value and a hold margin value for each virtual wiring connecting the data holding circuits;
    determining a combination of virtual wirings so that the hold error is reduced;
    reordering the data holding circuits based on the determined combination; and
    inserting one or more delay elements based on the determined number of delay elements between the scan-out terminal and a connection point of the further data holding circuit.

3. A method for eliminating a hold error from a scan chain configured by connecting a plurality of data holding circuits, wherein each data holding circuit has a scan-out terminal connected to a delay element and a further data holding circuit, the method comprising:
    determining a hold error value in the scan chain;
    determining the number of delay elements necessary to eliminate the hold error based on the hold error value; and
    inserting one or more delay elements based on the determined number of delay elements between the scan-out terminal and a connection point of the further data holding circuit.

4. A method for eliminating a hold error from a scan chain configured by connecting a plurality of data holding circuits, wherein each data holding circuit has a scan-out terminal connected to a delay element and a further data holding circuit, the method comprising:
    determining a position of a hold error in the scan chain and a hold error value;
    determining the number of delay elements necessary to eliminate the hold error based on the hold error value; and determining the number of delay elements necessary to eliminate the hold error based on the hold error value; and inserting one or more delay elements according to the determined number of delay elements between the scan-out terminal and a connection point of the further data holding circuit.

5. The method according to claim 4, wherein a plurality of delay elements are connected to the scan-out terminal of each data holding circuit, and said determining the number of delay elements includes:

detecting the delay elements connected to the scan-out terminal of each data holding circuit; and determining the number of delay elements necessary to eliminate the hold error based on the hold error value and the detected delay elements.

6. The method according to claim 5, wherein each of the plurality of delay elements is an inverter circuit, and said determining the number of delay elements includes determining an even number of inverter circuits based on the hold error value.

7. A method for eliminating a hold error from a scan chain configured by connecting a plurality of data holding circuits with wiring, wherein each data holding circuit has a scan-out terminal connected to a delay element by wiring and a further data holding circuit, the method comprising:

determining a position of a hold error in the scan chain, hold error value, and a hold margin value for each virtual wiring connecting the data holding circuits;

determining a combination of virtual wirings so that the hold error is reduced;

reordering the data holding circuits based on the determined combination;

re-determining the position of the hold error in the scan chain and the hold error value after said reordering;

selectively inserting a delay element between the data holding circuits to eliminate the hold error from the scan chain after the reordering.

8. The method according to claim 7, wherein a plurality of delay elements are connected to the scan-out terminal of each data holding circuit, and said determining the number of delay elements includes:

detecting the delay elements connected to the scan-out terminal of each data holding circuit; and determining the number of delay elements necessary to eliminate the hold error based on the hold error value and the detected delay elements.

9. The method according to claim 8, wherein each of the delay elements is an inverter circuit, and said determining the number of delay elements includes determining an even number of the inverter circuits based on the hold error value.

10. A method for eliminating a hold error from a scan chain comprised of a plurality of data holding circuits with wiring, the method comprising:

identifying the hold error in the scan chain;

determining a virtual wiring so that the hold error is maximally reduced;

reordering the data holding circuits based on the determined virtual wiring, determining a remaining hold error in the scan chain;

determining a number of delay elements corresponding to the remaining hold error;

inserting the determined number of delay elements between the data holding circuits.

* * * * *

UNITED STATES PATENT AND TRADEMARK OFFICE
CERTIFICATE OF CORRECTION

| | |
|---|---|
| PATENT NO. | : 7,480,844 B2 |
| APPLICATION NO. | : 11/156633 |
| DATED | : January 20, 2009 |
| INVENTOR(S) | : Shouji Sakuma et al. |

It is certified that error appears in the above-identified patent and that said Letters Patent is hereby corrected as shown below:

Column 8, Lines 41-44, claim 2, change
"inserting one or more delay elements based on the determined number of delay elements between the scan-out terminal and a connection point of the further data holding circuit." to
--selectively inserting a delay element between the data holding circuits to eliminate the hold error from the scan chain after the reordering.--.

Column 9, Lines 1-7, claim 4, change
"determining the number of delay elements necessary to eliminate the hold error based on the hold error value; and inserting one or more delay elements according to the determined number of delay elements between the scan-out terminal and a connection point of the further data holding circuit." to
--inserting one or more delay elements based on the determined number of delay elements between the scan-out terminal and a connection point of the further data holding circuit.--.

Column 9, Line 28, claim 7, before "hold error" insert --a--.

UNITED STATES PATENT AND TRADEMARK OFFICE
CERTIFICATE OF CORRECTION

PATENT NO. : 7,480,844 B2
APPLICATION NO. : 11/156633
DATED : January 20, 2009
INVENTOR(S) : Shouji Sakuma et al.

It is certified that error appears in the above-identified patent and that said Letters Patent is hereby corrected as shown below:

Column 10, Lines 3-5, claim 7, change "selectively inserting a delay element between the data holding circuits to eliminate the hold error from the scan chain after the reordering." to
--determining the number of delay elements necessary to eliminate the hold error based on the hold error value; and
  inserting one or more delay elements according to the determined number of delay elements between the scan-out terminal and a connection point of the further data holding circuit.--.

Signed and Sealed this

Ninth Day of June, 2009

JOHN DOLL
*Acting Director of the United States Patent and Trademark Office*

UNITED STATES PATENT AND TRADEMARK OFFICE
CERTIFICATE OF CORRECTION

PATENT NO.        : 7,480,844 B2
APPLICATION NO.   : 11/156633
DATED             : January 20, 2009
INVENTOR(S)       : Shouji Sakuma et al.

Page 1 of 1

It is certified that error appears in the above-identified patent and that said Letters Patent is hereby corrected as shown below:

On the title page item (73), (Assignee), change "Fujitsu Limited, Kawasaki (JP)" to
--Fujitsu Microelectronics Limited, Tokyo (JP)--.

Signed and Sealed this
Eighth Day of May, 2012

David J. Kappos
*Director of the United States Patent and Trademark Office*